(12) United States Patent
Biber (10) Patent No.: US 10,274,560 B2
(45) Date of Patent: Apr. 30, 2019

(54) USE OF A PLURALITY OF TX COILS

(71) Applicant: Stephan Biber, Erlangen (DE)

(72) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 1194 days.

(21) Appl. No.: 14/337,199

(22) Filed: Jul. 21, 2014

(65) Prior Publication Data

US 2015/0022208 A1   Jan. 22, 2015

(30) Foreign Application Priority Data

Jul. 22, 2013   (DE) .................. 10 2013 214 285

(51) Int. Cl.
   *G01R 33/38* (2006.01)
   *G01R 33/36* (2006.01)
(52) U.S. Cl.
   CPC ......... *G01R 33/38* (2013.01); *G01R 33/3664* (2013.01); *G01R 33/365* (2013.01)
(58) Field of Classification Search
   CPC ..................... G01R 33/38; G01R 33/3664
   See application file for complete search history.

(56) References Cited

U.S. PATENT DOCUMENTS

| | | | |
|---|---|---|---|
| 4,680,549 A | 7/1987 | Tanttu | |
| 5,243,287 A * | 9/1993 | Hashoian | ......... G01R 33/3657 324/318 |
| 6,850,067 B1 * | 2/2005 | Burl | ................... G01R 33/3657 324/318 |
| 6,943,551 B2 | 9/2005 | Eberler et al. | |
| 8,085,048 B2 | 12/2011 | Biber et al. | |
| 2002/0080911 A1 | 6/2002 | Friedrich et al. | |
| 2002/0145427 A1 | 10/2002 | Wong et al. | |
| 2003/0135110 A1 | 7/2003 | Leussler | |
| 2005/0127914 A1 | 6/2005 | Eberler et al. | |
| 2005/0174115 A1 | 8/2005 | Lazar et al. | |
| 2008/0079430 A1 | 4/2008 | Nistler et al. | |
| 2009/0237081 A1 | 9/2009 | Biber et al. | |
| 2010/0141259 A1 * | 6/2010 | Graesslin | ............ G01R 33/288 324/318 |

(Continued)

FOREIGN PATENT DOCUMENTS

| | | |
|---|---|---|
| CN | 1534305 A | 10/2004 |
| CN | 101539614 A | 9/2009 |

(Continued)

OTHER PUBLICATIONS

Lee et al., A Decoupled Circular-Polarized Volume Head Coil Pair for Studying Two Interacting Human Brains with MRI, 32nd Annual International Conference of the IEEE EMBS Buenos Aires, Argentina, 2010.*

(Continued)

*Primary Examiner* — Daniel Miller
(74) *Attorney, Agent, or Firm* — Lempia Summerfield Katz LLC (57) ABSTRACT

At least two RF transmission coil arrangements are provided. Each of the at least two RF transmission coil arrangements includes at least one RF transmission antenna. The at least two RF transmission coil arrangements are actuatable by a transmission apparatus of the magnetic resonance imaging system for transmitting RF pulses.

31 Claims, 3 Drawing Sheets

(56) References Cited

U.S. PATENT DOCUMENTS

| | | | |
|---|---|---|---|
| 2010/0207632 A1* | 8/2010 | Li | G01R 33/34084 324/318 |
| 2010/0225317 A1* | 9/2010 | Biber | G01R 33/3415 324/309 |
| 2011/0109315 A1 | 5/2011 | Biber et al. | |
| 2011/0279119 A1 | 11/2011 | Driemel et al. | |
| 2011/0291655 A1* | 12/2011 | Hamamura | G01R 33/3642 324/318 |
| 2012/0161772 A1 | 6/2012 | Biber et al. | |
| 2012/0223706 A1* | 9/2012 | Hetherington | G01R 33/34007 324/307 |
| 2012/0262173 A1 | 10/2012 | Soutome et al. | |
| 2013/0076358 A1 | 3/2013 | Taracila et al. | |
| 2013/0082707 A1* | 4/2013 | Biber | G01R 33/583 324/309 |
| 2013/0249560 A1 | 9/2013 | Okamoto et al. | |
| 2013/0281831 A1* | 10/2013 | Riederer | A61B 5/055 600/420 |
| 2014/0225613 A1* | 8/2014 | Reykowski | G01R 33/3628 324/309 |

FOREIGN PATENT DOCUMENTS

| | | |
|---|---|---|
| CN | 102053233 A | 5/2011 |
| CN | 102309324 A | 1/2012 |
| CN | 102313875 A | 1/2012 |
| CN | 103033777 A | 4/2013 |
| DE | 10051155 A1 | 5/2002 |
| DE | 10113661 A1 | 9/2002 |
| DE | 10314215 B4 | 11/2006 |
| DE | 102006046044 A1 | 4/2008 |
| DE | 102008014751 A1 | 10/2009 |
| JP | H0194834 A | 4/1989 |
| JP | 2004528893 A | 9/2004 |
| JP | 2005533537 A | 11/2005 |
| JP | 2006297122 A | 11/2006 |
| JP | 2009160015 A | 7/2009 |
| JP | 2012239723 A | 12/2012 |
| WO | WO2011065532 A1 | 6/2011 |
| WO | WO2013011406 A2 | 1/2013 |

OTHER PUBLICATIONS

Chinese Office Action for related Chinese Application No. 201410350075.2 dated Oct. 11, 2016 with English Translation.
German Office Action dated Jan. 2, 2014 in corresponding German Patent Application No. DE 10 2013 214 285.4 with English translation.
W. Wang et al., "Inductive Coupled Local TX Coil Design", Siemens Medical Solutions Magentic Resonance, 2009, 1 page, http://www.medical.siemens.com/siemens/en_INT/gg_mr_FBAs/files/MAGNETOM_World/ismrm_proceedings/ismrm_2010/1510.pdf.
Japanese Office Action for Japanese Application No. 2014-147643, dated Mar. 30, 2018.

* cited by examiner

FIG 3

USE OF A PLURALITY OF TX COILS

This application claims the benefit of DE 10 2013 214 285.4, filed on Jul. 22, 2013, which is hereby incorporated by referenced in its entirety.

BACKGROUND

The present embodiments relate to methods and devices for magnetic resonance imaging.

Magnetic resonance imaging (MRI) devices for examining objects or patients using magnetic resonance imaging are known from, for example, DE10314215B4, U.S. Pat. No. 4,680,549, or "Inductive Coupled Local TX Coil Design," by W. Wang, X. Lu, J. You, W. Zhang, H. Wang, H. Greim, M. Vester, and J. Wang, Siemens Mindit Magnetic Resonance Ltd, ShenZhen/GuangDong, Siemens Medical Solutions Magnetic Resonance/Erlangen, ISMRM 2010.

SUMMARY

The scope of the present invention is defined solely by the appended claims and is not affected to any degree by the statements within this summary.

The present embodiments may obviate one or more of the drawbacks or limitations in the related art. For example, MR imaging may be optimized.

DETAILED DESCRIPTION

Figure 3:
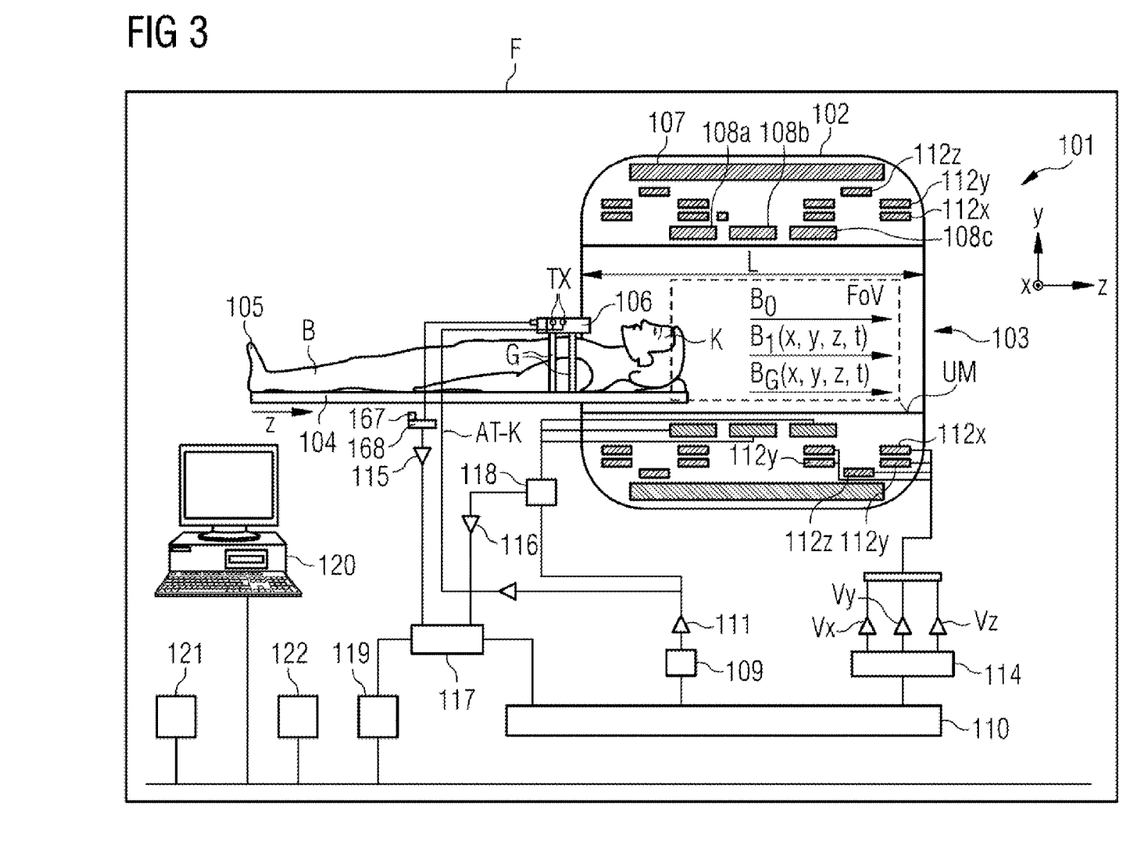
FIG. 3 shows an MRI system.

FIG. 3 shows a magnetic resonance imaging device MRI 101 (e.g., situated in a shielded room or Faraday cage F) including a whole body coil 102 with, for example, a tubular space 103 in which a patient couch 104 with a body of, for example, an examination object 105 (e.g., a body of a patient; with or without local coil arrangement 106) may be displaced in the direction of the arrow z in order to generate recordings of the patient 105 by an imaging method. In this case, a local coil arrangement 106 is arranged on the patient. Using the local coil arrangement in a local region (e.g., a field of view (FOV)) of the MRI, recordings of a portion of the body 105 in the FOV may be generated. Signals of the local coil arrangement 106 may be evaluated (e.g., converted into images, stored or displayed) by an evaluation device (e.g., including elements 168, 115, 117, 119, 120, 121, etc.) of the MRI 101 that may be connected to the local coil arrangement 106 using, for example, coaxial cables or by radio link (e.g., element 167), for example.

In order to use a magnetic resonance imaging device MRI 101 to examine a body 105 (e.g., an examination object or a patient) using magnetic resonance imaging, different magnetic fields that are precisely matched to one another in terms of temporal and spatial characteristics are radiated onto the body 105. A strong magnet (e.g., a cryomagnet 107) in a measurement cabin with an opening 103 that is tunnel-shaped generates a strong static main magnetic field B0 that has a strength of, for example, 0.2 Tesla to 3 Tesla or more.

A body 105 to be examined is, while supported by a patient couch 104, driven into a region of the main magnetic field B0 that is approximately homogeneous in the observation region FOV ("field of view"). The nuclear spins of atomic nuclei of the body 105 are excited by magnetic radiofrequency excitation pulses B1 (x, y, z, t) that are radiated in by a radiofrequency antenna (e.g., and/or, optionally, a local coil arrangement) that is shown in FIG. 3 in a much simplified manner as body coil 108 (e.g., multi-part coil 108 depicted in a simplified manner with rings 108a, 108b, 108c and longitudinal rods 108d-h). By way of example, radiofrequency excitation pulses are generated by a pulse generation unit 109 that is controlled by a pulse sequence control unit 110. After amplification by a radiofrequency amplifier 111, the radiofrequency excitation pulses are conducted to the radiofrequency antenna 108. The radiofrequency system shown is merely indicated schematically. In a magnetic resonance imaging device 101, more than one pulse generation unit 109, more than one radiofrequency amplifier 111, and a plurality of radiofrequency antennas 108a, b, c may be used.

The magnetic resonance imaging device 101 also includes gradient coils 112x, 112y, 112z, by which magnetic gradient fields $B_G$ (x, y, z, t) are radiated in during a measurement for selective slice excitation and for spatial encoding of the measurement signal. The gradient coils 112x, 112y, 112z are controlled by a gradient coil control unit 114 (e.g., and optionally via amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108 and/or at least one local coil arrangement 106, amplified by associated radiofrequency preamplifiers 116 and processed further and digitized by a reception unit 117. The recorded measurement data are digitized and stored as complex numbers in a k-space matrix. An associated MR image may be reconstructed from the k-space matrix filled with values using a multidimensional Fourier transform.

For a coil that may be operated both in transmission mode and in reception mode such as, for example, the body coil 108 or a local coil 106, the correct signal transmission is regulated by an upstream transmission/reception switch 118.

An image processing unit 119 generates an image from the measurement data. The image is displayed to a user by an operating console 120 and/or stored in a storage unit 121. A central computer unit 122 controls the individual installation components.

In MR imaging, images with a high signal-to-noise ratio (SNR) may be recorded using local coil arrangements (e.g., coils, local coils). The local coil arrangements are antenna systems that are attached in the direct vicinity on (e.g., anterior) or under (e.g., posterior), at, or in the body 105. During an MR measurement, the excited nuclei induce a voltage in the individual antennas of the local coil. The induced voltage is then amplified using a low-noise preamplifier (e.g., LNA, preamp) and transmitted to the reception electronics. In order to improve the signal-to-noise ratio even in the case of high resolution images, high-field installations (e.g., 1.5 T-12 T or more) may be used. If more individual antennas may be connected to an MR reception system than receivers are available, a switching matrix (e.g., RCCS), for example, is installed between reception antennas and receivers. The matrix routes the currently active reception channels (e.g., reception channels that currently lie in the field of view of the magnet) to the available receivers. As a result, more coil elements may be connected than receivers are available because, in the case of a whole body cover, only coils that are situated in the FOV or in the homogeneous volume of the magnet may be read out.

By way of example, an antenna system, which may, for example, include one antenna element or, as an array coil, several antenna elements (e.g., coil elements), may be referred to as local coil arrangement 106. By way of example, these individual antenna elements are embodied as loop antennas (e.g., loops), butterfly coils, flex coils or saddle coils. By way of example, a local coil arrangement includes coil elements, a preamplifier, further electronics (e.g., standing wave traps), a housing, supports and may include a cable with plug, by which the local coil arrangement is connected to the MRI installation. A receiver 168 attached to the installation-side filters and digitizes a signal received from a local coil 106 (e.g., by radio link), and transmits the data to a digital signal processing device that may derive an image or spectrum from the data obtained by the measurement, and makes the image or spectrum available to the user (e.g., for the subsequent diagnosis by the user and/or for storing).

Figure 1:
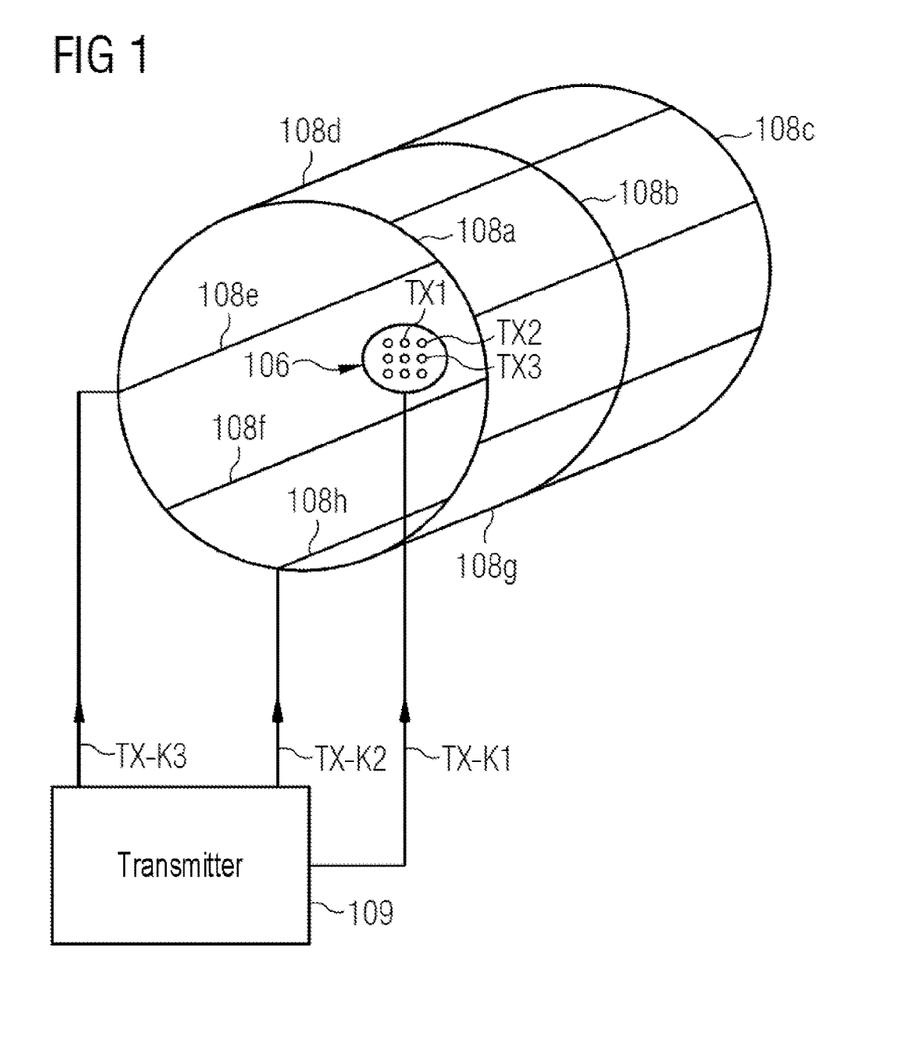
FIG. 1 shows, in a simplified perspective view, an embodiment in which transmission apparatuses of an MRI system are connected to a control unit.
Figure 2:
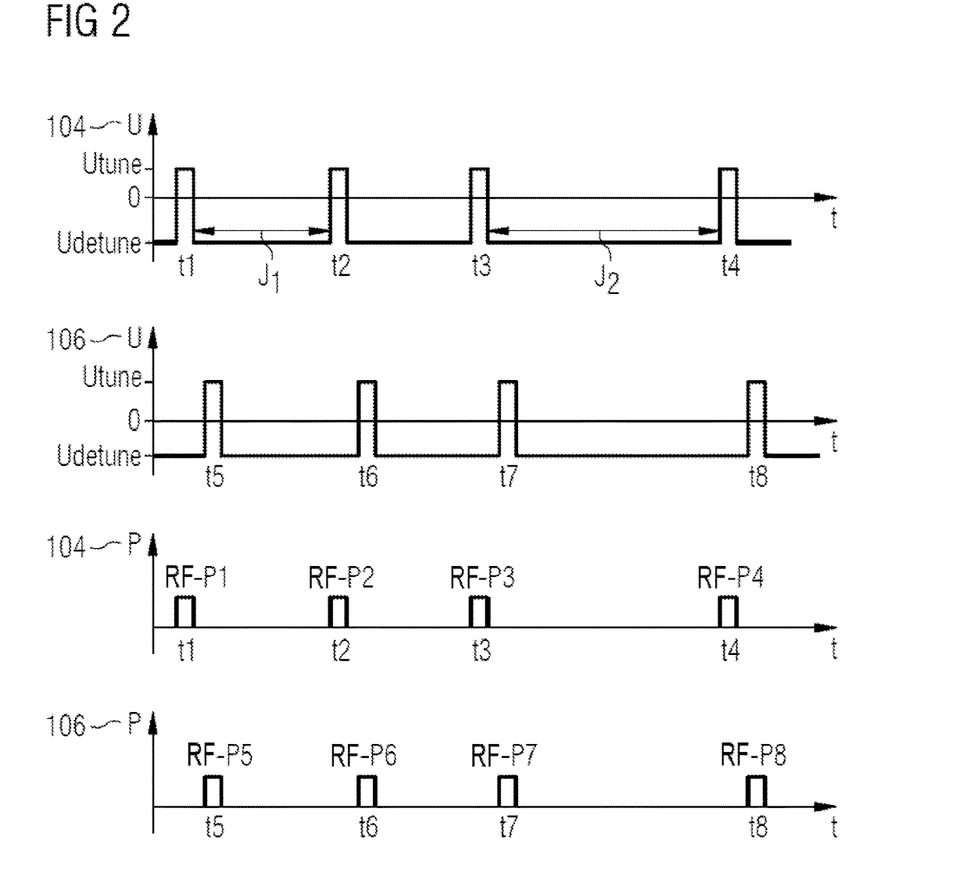
FIG. 2 shows, as a time profile, an exemplary time-offset actuation of two transmission apparatuses of an MRI system.

FIGS. 1-3 clarify details of exemplary embodiments.

The use of local transmission coil arrangements (e.g., local coils (LCs)) in nuclear magnetic resonance may have various advantages. Higher B1-field peak values (e.g., B1-field extrema) and/or higher B1-field average values may be obtained. Applications using very high B1 values within a very short period of time (e.g., short echo times, "metal imaging" for suppressing artifacts on implants, spectroscopy), for example, may profit from higher B1 peak values. Local transmission coil arrangements may have advantages for limiting the SAR if the local transmission coil arrangements apply the transmission field only to a dedicated part of the body (e.g., to the left knee of an examination object) and not to the whole body (e.g., of an examination object) situated in the body coil of an MRI device. Restricting the transmission field and a different field profile may allow advantages in designing the protocol (e.g., with respect to the direction of the phase encoding) since convolutions from other body parts, which are not to be examined, may be suppressed more strongly if no transmission field acts thereon. By way of example, a phase encoding direction in the z-direction may make do with less phase oversampling during the imaging recording of a knee or a head provided that the irradiation by a local knee or head coil is lower in the z-direction. These advantages apply to coils of a transmission apparatus transmitting both on a single channel and on a plurality of channels.

However, a disadvantage may emerge from the use of local transmitting coils. Not all types of examinations work well with a locally strongly restricted and possibly slightly more inhomogeneous transmission field from a local coil.

By way of example, if a cervical vertebrae examination is to be carried out following a head examination using a local transmission coil, the coil may be interchanged, and the patient may be repositioned.

Advantages of local transmission coils may include the following: a higher B1 peak; a lower global SAR; a lower local SAR; if it is easier for a transmission coil (TX) than a body coil BC to be placed slightly further away from the tissue to be examined (e.g., in the case of the body coil, this may be to the detriment of the magnet diameter, which may be cost-expensive); and a stronger localization of the field profiles for a more expedient protocol selection or improved orthogonality of transmission (TX) profiles (PTX).

A problem here may be that current local transmission coils, if connected to the system, should be used exclusively as transmission coils, and a transmission using the body coil BC of an MRI device is not to be allowed in the presence of a local TX coil as transmission coil arrangement for safety reasons (e.g., for avoiding patient burns by inductive coupling of BC and LC and focusing of the field from the BC by the local transmission coil). A special role may be currently assumed merely by inductively coupled transmission coils ("Inductive Coupled Local TX Coil Design," by Wang, Vester et al.). A local transmission coil is not supplied with transmission power by a cable, but is supplied with power inductively by the body coil BC. The field focusing, which is otherwise unwanted, is used in a targeted and correctly metered manner. However, as far as is known, no mode that, in the presence of the coil, permits transmission using the larger coil (BC) and detunes the "unwanted" coil, and therefore permits the selection of one or the other transmission coil, is currently provided for either type of transmission coil (e.g., cable-connected or inductively coupled).

Coil arrangements, in which transmission may alternately be brought about using the body coil BC of an MRI device or the local TX coil of an MRI device using a control unit of the MRI system, have not been realized. As a result of this, advantages of the local transmission coil may be employed for one examination/sequence type (e.g., pure head imaging) and relatively large regions may (e.g., thereafter) be irradiated by the body coil BC (e.g., for cervical vertebrae imaging) without the patient having to be repositioned in the meantime. Such a coil arrangement, associated circuit architectures, the actuation, and the examination progress are, together or as individual topics, subjects of configurations of the present embodiments.

Coil arrangements are described below.

By way of example, in FIG. 1 or 3, two transmission coil arrangements 104, 106 are situated in an MRI system 101. One transmission coil arrangement (e.g., a local coil (LC) 106) may be situated within the larger local coil arrangement (e.g., body coil (BC) 104), or this may relate to two transmission coil arrangements (e.g., of similar dimensions) at different locations in the MRI device 101. In one embodiment, using detuning circuits (e.g., resonant circuits that are switched by switches such as PIN diodes), both transmission coil arrangements are alternately or simultaneously tuned (e.g., to resonance, for transmission purposes) or detuned (e.g., for avoiding undesired resonance of the one transmission coil arrangement when the other transmission coil arrangement transmits, and vice versa). The detuning circuits may be configured such that high voltages, which one transmission coil arrangement may induce in the further transmission coil arrangement, may not lead to a drop in the detuning (e.g., sufficient effect of the detuning).

Possible circuit architectures for detuning may be the following. The transmission coil arrangements may be detuned by a comparatively high voltage applied by wires TX-K1, TX-K2, TX-K3, TX-K4 (e.g., typical voltages for this: 50-500 V). Alternately, the transmission coil arrangements may be pre-detuned by a comparatively low voltage (e.g., typical voltages for this: 1-50 V). The high voltage (e.g., DC voltage), which is suitable for detuning, for example, switches (e.g., PIN diode switches) is then generated by, for example, a rectifier circuit that obtains the voltage thereof from, for example, the inductively coupled alternating RF field from the transmission coil arrangement.

For safety reasons, a transmission coil arrangement (e.g., may also include additional reception coils or use transmission coils for reception) may advantageously be embodied such that if connectors are not inserted (e.g., because the connection was inadvertently omitted) into the MRI device 101 (e.g., via connectors in the patient couch thereof), the transmission coil arrangement detunes itself using the RF transmission field (e.g., detunes passively). The detuning circuits are only switched through by applying a voltage/current source using an external supply, and the coil arrangement comes into resonance and may be used for transmission purposes.

Circuit architectures for an RF power supply when actuating the RF transmission coil arrangements 104, 106 by a transmission apparatus 109 of the magnetic resonance imaging system are described below.

In one embodiment, a supply with RF pulses (RF-P1-RF-P8) via cables (e.g., TX-K1, TX-K2, TX-K3, TX-K4 in FIG. 1) is provided.

In another embodiment, a supply using inductively coupled power is provided (e.g. passively inductively coupled power).

By way of example, an examination progress may be as follows.

Transmission using one transmission coil arrangement 104, 106 in the presence of the further transmission coil arrangements 106, 104, and vice versa, may be provided, even if both are strongly coupled to one another.

By way of example, a transmission coil arrangement in the form of a body coil (BC) 104 may be used for generating an overview image of an examination object, and a local transmission coil arrangement in the form of a local coil 106 may then be used for an examination that is only more local.

Head examinations may take place using a head transmission coil, and spinal column examinations (e.g., cervical vertebrae) may take place using a body coil 104.

For example, there may be local excitation of the blood in the neck (e.g., arterial spin labeling), and there may be imaging of the labeled blood in the head using a neck transmission coil, followed by a head examination (e.g., a conventional examination) using a body coil 104.

All these examinations may also be realized by suitable actuating and detuning concepts only, without changing patient/coils.

Known circuits for detuning and for supplying power may be provided. In one or more of the present embodiments, however, the RF transmission coil arrangements may be combined with the actuation thereof such that the transmission using one of the RF transmission coil arrangements in the presence of the further RF transmission coil arrangement(s), and vice versa, is permitted and made possible. The detuning is dimensioned such that there is neither a risk to the patient from a detuned transmission coil arrangement, nor is a transmission field of a currently transmitting transmission coil arrangement significantly distorted.

The coil arrangements have different irradiation volumes and field profiles, and this difference may be used for employing the aforementioned advantages without disadvantages such as coil interchange/patient repositioning.

In one embodiment, not only may switching of the transmission from one transmission coil arrangement to the further transmission coil arrangement from one examination/sequence to the next be provided, but also very fast switching (e.g., with a cycle time of 10 microseconds to 100 ms) between the two coil arrangement types may be desirable for future applications. This may be made possible by a control unit 107 of the MRI device 101 permitting the selection of which transmission coil arrangement transmits from transmission pulse to transmission pulse and not only from one sequence type to the next.

Possible decoupling of both coils from one another for very special applications would be polarization decoupling. The coils transmit in, for example, mutually orthogonal polarization directions (e.g., the body coil 104 only with vertical polarization and the local coil 106 only with horizontal polarization). Optionally, this may be applicable for only some of the applications since this may harbor other disadvantages (e.g., relating to SAR).

Two or more transmitting transmission coil arrangements (e.g., optionally strongly inductively coupled to one another) may be arranged such that the TX irradiation and TX field profiles thereof in each case have coil-specific advantages (e.g., higher B1 peak, larger FOV, more homogeneous B1 profile, etc.) for different applications. These advantages may be employable via the local coils 106 of an MRI device 101 being dimensioned and actuated such that transmission with a transmitting transmission coil arrangement 104, 106 is possible in the presence of a further coil arrangement 106, 104, and vice versa. There is, in each case, no risk to a patient 105 from the unused (e.g., detuned) coil of a transmitting transmission coil arrangement, and there is no undesired influencing of the field profile of the other transmitting transmission coil arrangement 106, 104. As a result, a locally transmitting transmission coil arrangement 106 (also, a hybrid coil with N=I–X transmission channels and M=1–Y reception channels) may be left in the transmission field of a larger, transmitting transmission coil arrangement (e.g., BC 104), and transmitting transmission coil arrangement 106/104 may be employed for the examination that only has the best properties for the respective examination.

In detail, FIG. 1 shows, in a simplified manner, an embodiment in which a plurality of RF transmitting transmission coil arrangements 104, 106 of an MRI device 101 are connected to a control unit 109 (e.g., with a transmitter for generating RF pulses therein) via transmission cables TX-K1, TX-K2, TX-K3 (e.g., for transmitting RF pulses such as RF-P1-RF-P4 in FIG. 2 and RF transmission power). The RF transmitting transmission coil arrangements may respectively be actuated by the control unit 107 for transmitting RF pulses (e.g., RF pulses shown in FIG. 2).

FIG. 1 shows an RF transmission coil arrangement in the form of a body coil (BC) 104 including a plurality of antennas 108a, 108b, 108c, 108d, 108b, 108f, 108g, 108h and an RF transmission coil arrangement in the form of a local coil 106 including a plurality of antennas TX1, TX2, TX3, etc. (e.g., embodied as an array; in any form and arrangement) and possibly including corresponding reception antennas RX. The antennas TX1, TX2, TX3 etc. may alternately be actuated individually, and/or a plurality of the antennas TX1, TX2, TX3 may be actuated together/at the same time for transmitting RF pulses.

The RF transmission coil arrangements 104, 106 may be inductively coupled to one another or may be decoupled.

By way of example, at any given time t, the transmission apparatus 109 (e.g., with the transmitter) only ever actuates one of the RF transmission coil arrangements 104, 106 for transmitting RF pulses, while the other RF transmission coil arrangement 106, 104 may be actively and/or passively detuned to, for example, RF pulses with a specific frequency.

FIG. 2 shows, as an example, how the control and transmission apparatus 109 at any given time (t) actuates either only one RF transmission coil arrangement 104, 106 in the form of a local coil 106 or only one RF transmission coil arrangement in the form of a body coil 104 for transmitting RF pulses.

In the first line from the top, FIG. 2 depicts DC voltages Utune, Udetune or currents that are applied (e.g., passively and/or by a control unit 107) to an RF transmission coil arrangement in the form of a body coil 104 over time t at times t1, t2, t3, t4 in order, depending on the level of the applied voltage, to tune the body coil 104 with Utune (into resonance) or detune the body coil 104 with Udetune.

In the second line from the top, FIG. 2 depicts DC voltages Utune, Udetune or currents that are applied (e.g., passively by a field and/or actively by a control unit 107) to an RF transmission coil arrangement in the form of a body coil 104 over time t at times t5, t6, t7, t8 in order, depending on the level of the applied voltage, to tune the body coil 104 with Utune (e.g., into resonance) or detune the body coil 104 with Udetune.

In the third line from the top, FIG. 2 depicts pulse power amplitudes P(104) from one RF transmission coil arrangement in the form of a body coil 104, over time t, at times t1, t2, t3, t4 of the emitted RF pulses RF-P1, RF-P2, RF-P3, RF-P4.

In the fourth line from the top, FIG. 2 depicts pulse power amplitudes P(106) from one RF transmission coil arrangement in the form of a local coil 106, over time t, at times t5, t6, t7, t8 of the emitted RF pulses RF-P5, RF-P6, RF-P7, RF-P8. By way of example, time intervals are, for example, I1=0.01 to 10 000 ms within a sequence and/or I2=1 ms to 600 seconds between two sequences (e.g., of RF pulses).

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging (MRI) system comprising:
at least two radio frequency (RF) transmission coil arrangements, each RF transmission coil arrangement of the at least two RF transmission coil arrangements comprising at least one RF transmission antenna;
a transmission apparatus operable to actuate the at least two RF transmission coil arrangements alternately for emitting RF power; and
detuning circuits for detuning RF transmission coil arrangements of the at least two RF transmission coil arrangements, the detuning circuits being detunable by a voltage of 50-500 V applied to the detuning circuits by a wired connection,
wherein the detuning circuits are suppliable with a voltage of 1 V-50 V applied to the detuning circuits by a wired connection, and
wherein an additional voltage that is appliable to the detuning circuits is generatable by a rectifier circuit for detuning PIN diode switches, a voltage of the rectifier circuit being obtainable from an inductively coupled alternating RF field of at least one RF transmission coil arrangement of the at least two RF transmission coil arrangements.

2. The MRI system of claim 1, wherein the transmission apparatus is operable to actuate a plurality of RF transmission coil arrangements of the at least two RF transmission coil arrangements together at a same time for transmission purposes.

3. The MRI system of claim 1, wherein the at least two RF transmission coil arrangements are inductively coupled to one another.

4. The MRI system of claim 1, wherein the transmission apparatus is configured to actuate the at least two RF transmission coil arrangements for a different spatial TX irradiation, for time-varying TX field profiles, or for a combination thereof.

5. The MRI system of claim 4, wherein the transmission apparatus is configured to actuate the at least two RF transmission coil arrangements for different applications.

6. The MRI system of claim 5, wherein the transmission apparatus is configured to actuate the at least two RF transmission coil arrangements without modified position of a patient, without modified position of the at least two RF transmission coil arrangements, or a combination thereof.

7. The MRI system of claim 1, wherein the transmission apparatus is configured such that, at any given time, only one RF transmission coil arrangement of the at least two RF transmission coil arrangements is actuated for emitting the RF power.

8. The MRI system of claim 1, wherein the transmission apparatus is configured such that, at any given time, only one RF transmission coil arrangement of the at least two RF transmission coil arrangements is actuated for emitting the RF power, and another RF transmission coil arrangement of the at least two RF transmission coil arrangements is detuned for emitting the RF power.

9. The MRI system of claim 1, wherein current for detuning an RF transmission coil arrangement of the at least two RF transmission coil arrangements is completely or partly generatable from a transmission field of another RF transmission coil arrangement of the at least two RF transmission coil arrangements by rectification.

10. The MRI system of claim 1, wherein the transmission apparatus is configured such that, for an imaging examination, only an RF transmission coil arrangement of the at least two RF transmission coil arrangements that has better properties for an examination is used for transmission purposes.

11. The MRI system of claim 1, wherein one RF transmission coil arrangement of the at least two RF transmission coil arrangements is a local coil, and another RF transmission coil arrangement of the at least two RF transmission coil arrangements is a whole body coil.

12. The MRI system of claim 1, wherein the transmission apparatus is configured, at any given time, to actuate only one RF transmission coil arrangement of the at least two RF transmission coil arrangements in the form of a local coil or only one RF transmission coil arrangement of the at least two RF transmission coil arrangements in the form of a whole body coil for emitting the RF power.

13. The MRI system of claim 1, wherein the transmission apparatus is configured such that, for a first imaging examination of a region of a patient, only one RF transmission coil arrangement of the at least two RF transmission coil arrangements in the form of a local coil is actuated at certain times for emitting the RF power, and for a second imaging examination, taking place after or before the first imaging examination in time, of a further region of the patient at further times, only one RF transmission coil arrangement of the at least two RF transmission coils arrangements in the form of a whole body coil is actuated for emitting the RF power.

14. The MRI system of claim 1, wherein one RF transmission coil arrangement of the at least two RF transmission coil arrangements is situated within another RF transmission coil arrangement of the at least two RF transmission coil arrangements.

15. The MRI system of claim 1, wherein two RF transmission coil arrangements of the at least two RF transmission coil arrangements are a local coil, or each of the two RF transmission coil arrangements is a local coil.

16. The MRI system of claim 1, wherein one or two RF transmission coil arrangements of the at least two RF transmission coil arrangements are connected or connectable to the detuning circuits, or each of the one or two RF transmission coil arrangements is connected or connectable to a corresponding detuning circuit of the detuning circuits.

17. The MRI system of claim 16, wherein the detuning circuit comprises a resonant circuit, switches, or the resonant circuit and the switches.

18. The MRI system of claim 17, wherein the switches are PIN diodes.

19. The MRI system of claim 1, wherein the additional voltage is a DC voltage.

20. The MRI system of claim 1, wherein at least one RF transmission coil arrangement of the at least two RF transmission coil arrangements is dimensioned such that when connection plugs of the at least one RF transmission coil arrangement are not connected to a patient table, an MRI device, or the patient table and the MRI device, the at least one RF transmission coil arrangement detunes the at least one RF transmission coil arrangement with the aid of voltages, currents, or voltages and currents induced by RF pulses from further RF transmission coil arrangements of the at least two RF transmission coil arrangements.

21. The MRI system of claim 1, wherein by applying a voltage source, a current source, or the voltage source and the current source using an external supply, detuning circuits are switchable through to one or more RF transmission coil arrangements of the at least two RF transmission coil arrangements in order to detune one RF transmission coil arrangement of the one or more RF transmission coil arrangements, in order to switch another RF transmission coil arrangement of the one or more RF transmission coil arrangements to be resonant, or a combination thereof.

22. The MRI system of claim 1, further comprising a control unit configured to enable emission of the RF power from one RF transmission coil arrangement of the at least two RF transmission coil arrangements while at least one further RF transmission coil arrangement of the at least two RF transmission coil arrangements is present in the MRI system.

23. The MRI system of claim 1, wherein the MRI system is configured such that, after an imaging examination of an examination object, after a sequence prior to a next imaging examination, or after the imaging examination and after the sequence prior to the next imaging examination, there is automatic switching from emission of the RF power by one RF transmission coil arrangement of the at least two RF transmission coil arrangements to a further RF transmission coil arrangement of the at least two RF transmission coil arrangements.

24. The MRI system of claim 1, wherein the MRI system is configured such that, during an imaging examination of an examination object, a sequence, or the imaging examination and the sequence, there is automatic switching from emission of the RF power by one RF transmission coil arrangement of the at least two RF transmission coil arrangements to a further RF transmission coil arrangement of the at least two RF transmission coil arrangements with a cycle time of 10 µs-100 ms.

25. The MRI system of claim 1, further comprising a control unit configured to enable selection of one RF transmission coil arrangement of the at least two RF transmission coil arrangements for emitting the RF power, and selection of another RF transmission coil arrangement of the at least two RF transmission coil arrangements for one or more subsequent emissions of the RF power.

26. The MRI system of claim 1, wherein one RF transmission coil arrangement of the at least two RF transmission coil arrangements is decoupleable from a further RF transmission coil arrangement of the at least two RF transmission coil arrangements by polarization decoupling.

27. The MRI system of claim 1, wherein the at least two RF transmission coil arrangements are configured to transmit, receive, or transmit and receive in mutually orthogonal polarization directions.

28. The MRI system of claim 27, wherein a first RF transmission coil arrangement of the at least two RF transmission coil arrangements is configured for transmitting only with vertical polarization, and a second RF transmission coil arrangement of the at least two RF transmission coil arrangements is configured for transmitting only with horizontal polarization.

29. The MRI system of claim 1, wherein two RF transmission coil arrangements of the at least two RF transmission coil arrangements are connected to one another in a nonconductive manner, are electrically isolated from one another, or a combination thereof.

30. A method for magnetic resonance imaging (MRI) using an MRI system, the MRI system comprising at least two radio frequency (RF) transmission coil arrangements, a transmission apparatus operable, at any given time, to actuate the at least two RF transmission coil arrangements for emitting RF power alternatively, and detuning circuits detunable by a voltage of 50-500 V applied to the detuning circuits by a wired connection, each RF transmission coil arrangement of the at least two RF transmission coil arrangements comprising at least one RF transmission antenna, the method comprising:
  actuating, by the transmission apparatus, only one RF transmission coil arrangement of the at least two RF transmission coil arrangements for emitting the RF power, and
  detuning, by the detuning circuits, RF transmission coil arrangements of the at least two RF transmission coil arrangements,
  wherein the detuning circuits are suppliable with a voltage of 1 V-50 V applied to the detuning circuits by a wired connection, and
  wherein an additional voltage that is appliable to the detuning circuits is generatable by a rectifier circuit for detuning PIN diode switches, a voltage of the rectifier circuit being obtainable from an inductively coupled alternating RF field of at least one RF transmission coil arrangement of the at least two RF transmission coil arrangements.

31. The method of claim 30, further comprising:
  actuating, by the transmission apparatus for a first imaging examination of a region of a patient at first times, one RF transmission coil arrangement of the at least two RF transmission coil arrangements in the form of a local coil for emitting the RF power; and actuating, by the transmission apparatus for a second imaging examination of a further region of the patient at further times taking place before or after the first imaging examination in time, only one RF transmission coil arrangement of the at least two RF transmission coil arrangements in the form of a whole body coil for emitting the RF power, wherein an RF transmission coil arrangement of the at least two RF transmission coil arrangements currently not emitting in each case is decoupled by a voltage, a current, or the voltage and the current, is switched to be non-resonant, or a combination thereof.

* * * * *